United States Patent [19]

Fritschy et al.

[11] Patent Number: 4,932,411

[45] Date of Patent: Jun. 12, 1990

[54] INTERVIVO COIL FOR A NUCLEAR MAGNETIC RESONANCE TOMOGRAPHIC APPARATUS

[75] Inventors: Peter Fritschy, Bern, Switzerland; Horst Weber, Adelsdorf; Walter Lorenz, Heidelberg, both of Fed. Rep. of Germany; Otto Pastyr, Leimen; Volker Sturm, Wiesloch, both of Fed. Rep. of Germany; Hans-Joachim Zabel; Reiner Bader, both of Heidelberg, Fed. Rep. of Germany

[73] Assignee: Siemens Aktiengesellschaft, Berlin and Munich, Fed. Rep. of Germany

[21] Appl. No.: 943,891

[22] Filed: Dec. 18, 1986

Related U.S. Application Data

[63] Continuation of Ser. No. 758,824, Jul. 25, 1985, abandoned.

[30] Foreign Application Priority Data

Aug. 9, 1984 [DE] Fed. Rep. of Germany ....... 3429386

[51] Int. Cl.$^5$ ................................................ A61B 5/05
[52] U.S. Cl. .................................. 128/653 A; 324/318
[58] Field of Search ............................... 324/318–322, 324/309; 128/653, 657, 692

[56] References Cited

U.S. PATENT DOCUMENTS

| | | | |
|---|---|---|---|
| 3,757,773 | 9/1973 | Kolin | 128/692 |
| 3,838,683 | 10/1974 | Kolin | 128/692 |
| 3,896,373 | 7/1975 | Zelby | 128/692 |
| 3,941,119 | 3/1976 | Corrales | 128/657 |
| 4,095,168 | 6/1978 | Hlavka | 324/322 |
| 4,164,939 | 8/1979 | Kolin | 128/692 |
| 4,240,439 | 12/1980 | Abe et al. | 128/653 |
| 4,299,226 | 11/1981 | Banka | 128/657 |
| 4,432,369 | 2/1984 | Halvorsen | 128/653 |

FOREIGN PATENT DOCUMENTS

2056081 3/1981 United Kingdom .

OTHER PUBLICATIONS

Kantor et al., "A Catheter NMR Probe for in Vivo NMR Measurements of Internal Organs", Aug. 1983, In Vivo Spectroscopy I, p. 192.

Primary Examiner—Ruth S. Smith
Attorney, Agent, or Firm—Hill, Van Santen, Steadman & Simpson

[57] ABSTRACT

An intervivo probe for a nuclear magnetic resonance tomographic apparatus has a measuring coil carried at one end of a thin plastic carrier, the coil having a cross-sectional area in the range of approximately a few square millimeters and a length of approximately 10 to 20 mm. The measuring probe is inserted in body organs, such as the brain, liver and kidney by means of cannulae or channels which have been surgically or otherwise inserted in the organ for other purposes.

4 Claims, 2 Drawing Sheets (ENLARGED SCALE)

INTERVIVO COIL FOR A NUCLEAR MAGNETIC RESONANCE TOMOGRAPHIC APPARATUS

This is a continuation of application Ser. No. 758,824, filed July 25, 1985, now abandoned.

BACKGROUND OF THE INVENTION

1. Field of the Invention

The present invention relates to nuclear magnetic resonance tomographic devices, and in particular to a probe for such a device for introducing a measuring coil into organs of an examination subject.

2. Description of the Prior Art

Nuclear magnetic resonance tomographic devices for representing partial regions of the interior of an examination patient are known in the art which utilize coils for generating a basic magnetic field and a potential gradient field, and a measuring coil for detecting the deflection of the nuclear spin of the examination subject from its position of equilibrium by means of high frequency magnetic excitation pulses such as 90° HF pulses and 180° HF pulses.

An apparatus of this type is described in German patent application No. P 31 35 33 5.5. In this apparatus it is possible to deflect the nuclear spins of the atoms of an examination subject from a preferred direction, produced by the basic magnetic field, by means of a high frequency excitation pulse. During the perturbation of the nuclear spin occurring after the excitation pulse, that is, during the procession of the nuclear spin, a signal is generated having a frequency which is dependent upon the intensity of the basic magnetic field. By superimposing a field gradient on the homogeneous basic magnetic field, such that the magnetic field distribution varies spatially, it is possible to designate location of various objects by the individually measured frequency. In this manner, as well as by changing the direction of the field gradient, tomographic images of the examination subject are produced. The nuclear excitation in a layer of the examination subject occurs such that the basic magnetic field is influenced by the additional field gradient such that excitation of the nuclear spins occurs only in the selected layer or slice. This can be achieved because the excitation occurs only at a frequency which is precisely matched with the magnetic field in the desired layer.

Apart from tomographic technology, it is known to implant radioactive substances directly in a tumor cell for localized treatment of tumor cells in the human brain. The implantation proceeds by means of small diameter plastic cannulae which are inserted by surgery in a stereotaxic operation. It is also known to examined body organs such as the liver and the kidney with the aid of a hollow biopsy needle.

SUMMARY OF THE INVENTION

It is an object of the present invention to provide a means for generating locally resolved tomographs of specific body organs such as the brain, liver and kidney using nuclear magnetic resonance technology. The above object is inventively achieved in a nuclear magnetic resonance tomography device having a measuring coil which is introduced into the interior of the body through channels or cannulae which have heretofore been utilized for other purposes. The measuring coil is then utilized in conjunction with the conventional nuclear magnetic resonance apparatus to generate spectroscopic information at a highly localized and selected area of the patient. The measuring coil is provided on a thin carrier having a cross-sectional area on the magnitude of a few square millimeters, which is also approximately the diameter of the coil. The coil may have a length of approximately 10 to 20 mm.

DESCRIPTION OF THE PREFERRED EMBODIMENTS

Figure 1:
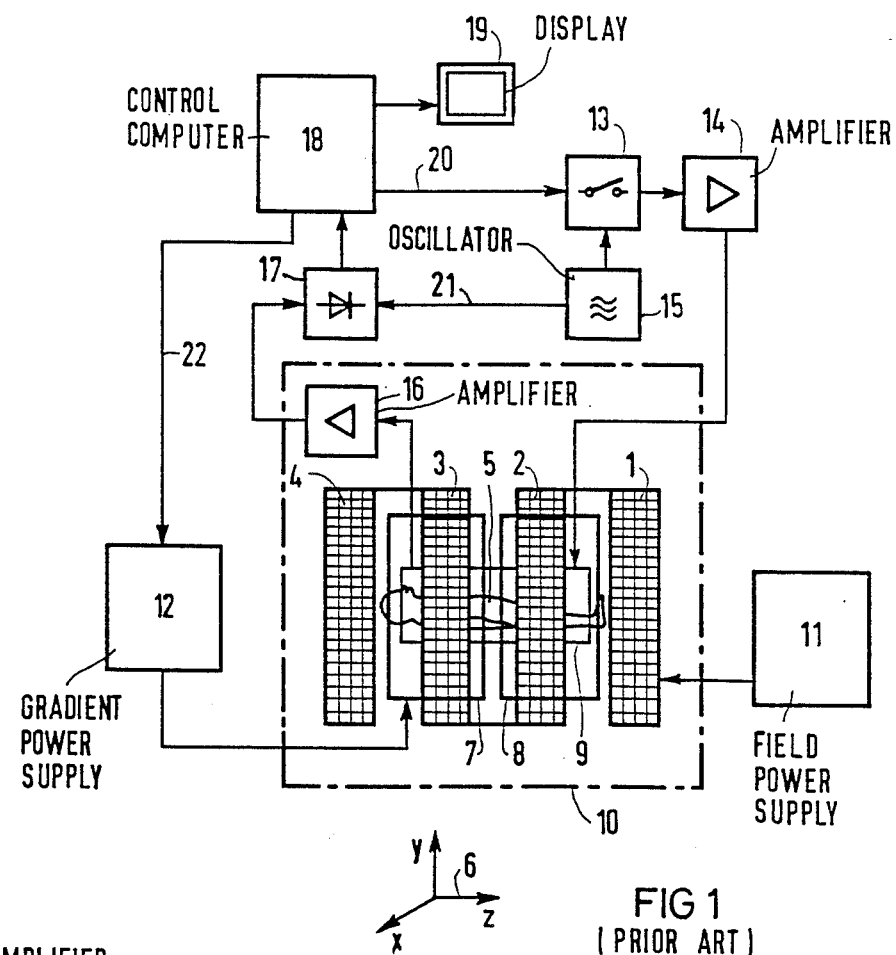
FIG. 1 is a schematic block diagram of a nuclear magnetic resonance tomographic apparatus of the type which is known to those skilled in the art.

A nuclear magnetic resonance tomographic apparatus of the type described in the aforementioned German patent application No. P 31 35 335.5 is shown in FIG. 1. The apparatus includes magnetic coils 1, 2, 3 and 4 which generate a DC magnetic field $B_0$ within which a patient 5 to be examined is disposed. The apparatus also has gradient coils associated with the field coils for generating independent orthogonal magnetic field gradients in the x, y and z directions, as shown by the orientation referenced 6 in FIG. 1. In FIG. 1, for simplification, only potential gradient coils 7 and 8 are shown which, together with a pair of oppositely disposed similar potential gradient coils (not shown) function to generate the x-potential gradient. Similar y-potential gradient coils disposed parallel to the patient 5 above and below the patient, and coils for generating the z-potential gradient field disposed transversely to the patient's longitudinal axis at his head and feet will also be understood by those skilled in the art to be present, although not illustrated.

The apparatus further includes a high frequency coil 9 which excites nuclear magnetic resonance and also receives the nuclear magnetic resonance signals.

The coils 1 through 9, as schematically indicated by the dot and dash line 10, represent the actual examination instrument which surrounds the patient. The instrument 10 and its components are operated as taught by German OSP No. 31 35 335.5 from an electrical arrangement which includes a field power supply 11 for operating the coils 1, 2, 3 and 4, and a gradient power supply 12 for operating the potential gradient coils 7 and 8 as well as the non-illustrated potential gradient coils. The high frequency coil 9, serving both the purpose of excitation and reception of the resonance signal, is connected through a modulator 13, such as a switch, and a transmitting amplifier 14 to a high frequency oscillator 15. The high frequency coil 9 is also connected through a signal amplifier 16 and a phase-selective rectifier 17 to a process control computer 18. The computer 18 constructs an image from the signals received from the high frequency coil 9, and provides signals to a screen display device 19 for visual representation of the tomographic image. A control line 20 is provided between the computer 18 and the modulator 13. Another control line connects the oscillator 15 to the rectifier 17, and a control line 22 is connected between the computer 18 and the gradient supply 12.

Figure 2:
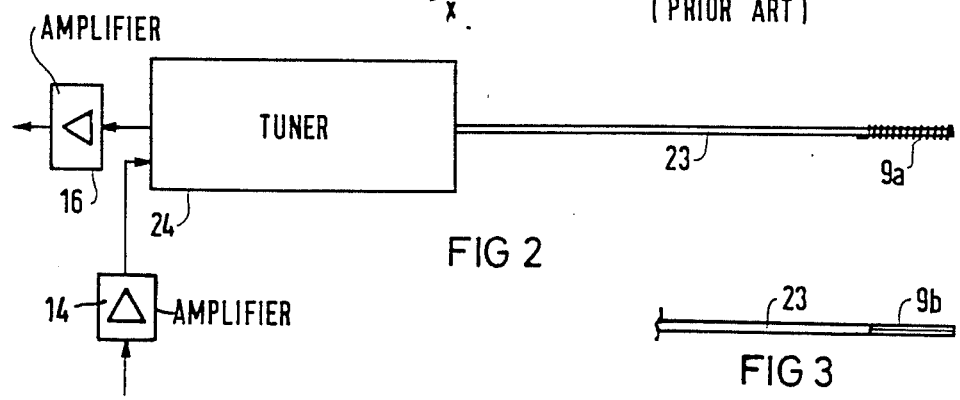
FIG. 2 is a side view together with a schematic block diagram probe for a nuclear magnetic resonance tomographic apparatus, such as the apparatus shown in FIG. 1, constructed in accordance with the principles of the present invention.

The high frequency coil 9 is designed such that sectional images or slices of the patient 5 can be displayed. A probe and operating components constructed in accordance with the principles of the present invention are shown in FIG. 2 for providing an additional measuring coil 9a. The coil 9a is wound in the embodiment of FIG. 2 on a plastic carrier 23, and has a diameter of approximately 2 mm. The coil 9a is electrically connected to a tuner 24 which is connectable with the signal amplifier 16 and the transmitting amplifier 14. The measuring coil 9a may have a length in the range of 10 to 20 mm, preferably 18 mm. The plastic carrier has a total length of approximately 100 mm. The size of the measuring coil 9a makes it possible to guide the coil 9a, with the aid of the plastic carrier 23, into a channel of the human body, for example, directly to a tumor in order to obtain spectroscopic information regarding the tumor. The carrier 23 and the coil 9a carried thereon may be inserted, for example, through cannulae otherwise utilized to insert radioactive substances into the tumor, or through biopsy needles. Due to the selected geometry, the sensitive volume lies outside the measuring coil 9a. Spherical measuring volumes of approximately 7 mm in diameter are obtained, which surround the ends of the coil. The measuring coil 9a as shown in FIG. 2 is suitable for examination of regions of the human brain, but may also be utilized to examine regions of other organs which are accessible by means of hollow needles or cannulae, such as the liver and the kidney.

Figure 3:
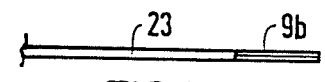
FIG. 3 is a side view of a further embodiment of a probe for a nuclear magnetic resonance tomographic apparatus constructed in accordance with the principles of the present invention.
Figure 3A:
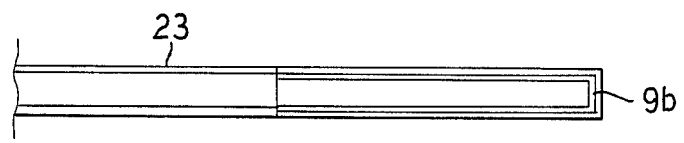
FIG. 3a is a plan view of the embodiment of FIG. 3.

The cross-section of the measuring coil 9a may be circular, square or rectangular. The axis of the measuring coil 9a is coincident with the axis of the plastic carrier 23 in the embodiment shown in FIG. 2. In the embodiment of FIG. 3 and FIG. 3a it is easier to optimally align the measuring coil 9b in relation to the static magnetic fields, and to the high frequency coil 9 by rotation of the plastic carrier 23. In the embodiment of FIG. 3 and FIG. 3a, the coil 9b is in the form of a loop or frame surrounding the distal end of the carrier 23, and the primary radiation pattern of the measuring coil is oriented to be disposed perpendicularly with respect to the static magnetic field and to the axis of the high frequency coil 9. In the embodiment of FIG. 3 and FIG. 3a, the measuring coil 9b has a rectangular cross-section and may be permanently mounted to the end of the carrier 23 such as, for example, by cementing or other suitable adhesive means.

Although modifications and changes may be suggested by those skilled in the art it is the intention of the inventors to embody within the patent warranted hereon all changes and modifications as reasonably and properly come within the scope of their contribution to the art.

We claim as our invention:

1. A nuclear magnetic resonance tomographic apparatus comprising:
   means for generating a basic magnetic field in an examination subject for defining a nuclear spin equilibrium position therein;
   means for generating a plurality of potential gradient magnetic fields superimposed on said basic field in said examination subject;
   first coil means connected to an RF source for exciting nuclear spins in a selected layer of said examination subject and for detecting signals characteristic of said spins;
   second coil means for exciting nuclear spins in a local volume of the examination subject surrounding said second coil and for detecting signals characteristic of the local volume spins, said second coil being carried on a carrier and being wound around a distal end of said carrier in a circular-cross section, and being insertable through a cannula into an organ of said examination subject;
   a tuner connected to said second coil for tuning said second coil to excite and detect nuclear spins at a selected frequency; and
   computer means connected to said first and second coils for generating a displayable set of data from the signals received from said coils.

2. A nuclear magnetic resonance tomographic apparatus as claimed in claim 1 wherein said second coil means on said carrier has a length in the range of 10 to 20 mm.

3. A nuclear magnetic resonance tomographic apparatus as claimed in claim 2 wherein said second coil means carried on said carrier has a length of 18 mm.

4. A nuclear magnetic resonance tomographic apparatus comprising:
   means for generating a basic magnetic field in an examination subject for defining a nuclear spin equilibrium position therein;
   means for generating a plurality of potential gradient magnetic fields superimposed on said basic field in said examination subject;
   first coil means connected to an RF source for exciting nuclear spins in a selected layer of said examination subject and for detecting signals characteristic of said spins;
   second coil means for exciting nuclear spins in a local volume of the examination subject surrounding said second coil and for detecting signals characteristic of the local volume spins, said second coil being carried on a carrier and having the form of a frame surrounding a distal end of said carrier and being insertable through a cannula into an organ of said examination subject;
   a tuner connected to said second coil for tuning said second coil to excite and detect nuclear spins at a selected frequency; and
   computer means connected to said first and second coils for generating a displayable set of data from the signals received from said coils.

* * * * *